United States Patent

[19]

Copper

[11] Patent Number: 6,100,823

[45] Date of Patent: Aug. 8, 2000

[54] SINGLE SENSOR POSITION ENCODER PROVIDING TWO LEVELS OF RESOLUTION

[75] Inventor: Andrew James Copper, Leeds, United Kingdom

[73] Assignee: Switched Reluctance Drives Limited, Harrogate, United Kingdom

[21] Appl. No.: 08/873,272

[22] Filed: Jun. 11, 1997

[30] Foreign Application Priority Data

Jun. 11, 1996 [GB] United Kingdom ............... 9612148

[51] Int. Cl.[7] ........................................... H03M 1/30
[52] U.S. Cl. ................................................... 341/11; 341/7
[58] Field of Search ...................... 341/3, 6, 7, 9, 341/10, 11

[56] References Cited

U.S. PATENT DOCUMENTS

| 5,206,645 | 4/1993 | Urich ........................................ 341/11 |
| 5,373,206 | 12/1994 | Lim . |
| 5,438,330 | 8/1995 | Yamazaki et al. ......................... 341/11 |
| 5,650,779 | 7/1997 | Sugden ........................................ 341/9 |

FOREIGN PATENT DOCUMENTS 0 533 413 A1   3/1993   European Pat. Off. .
0 630 097 A2   12/1994  European Pat. Off. .

OTHER PUBLICATIONS

"The Characteristics, Design and Applications of Switched Reluctance Motors and Drives", by Stephenson and Blake, presented at the PCIM '93 Conference and Exhibition at Nurnberg, Germany, Jun. 21–24, 1993.

*Primary Examiner*—Howard L. Williams
*Attorney, Agent, or Firm*—Patterson & Keough, P.A.

[57] ABSTRACT

A rotor position encoder is provided for an electrical machine having a rotor and a stator, the encoder including a coded disc having teeth of widths that vary in a repeating sequence and being arranged to rotate with the rotor past a sensor which outputs a signal corresponding to the coded sequence. By comparing the coded signal with an internally generated signal the position of the rotor can be determined at a first resolution level. In addition, a counter is enabled as each tooth is sensed and provides a second output signal at a higher resolution level indicative of the rotor position between successive teeth. For a multi-phase machine, a value representative of the rotor position relative to each phase is combined with the value representative of the incremental position common to all phases. High resolution rotor position encoding with simplified logic is thus provided.

31 Claims, 13 Drawing Sheets

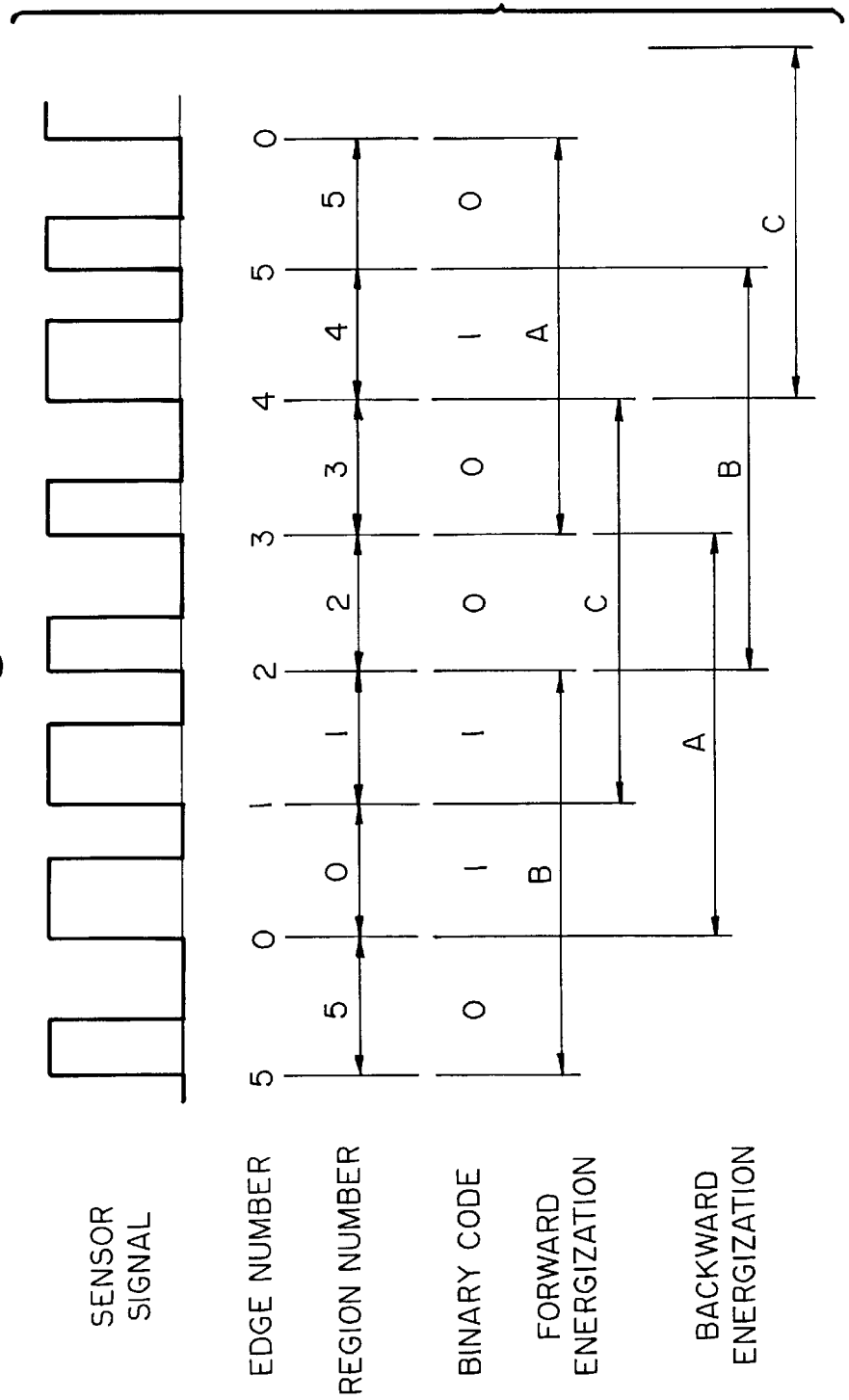

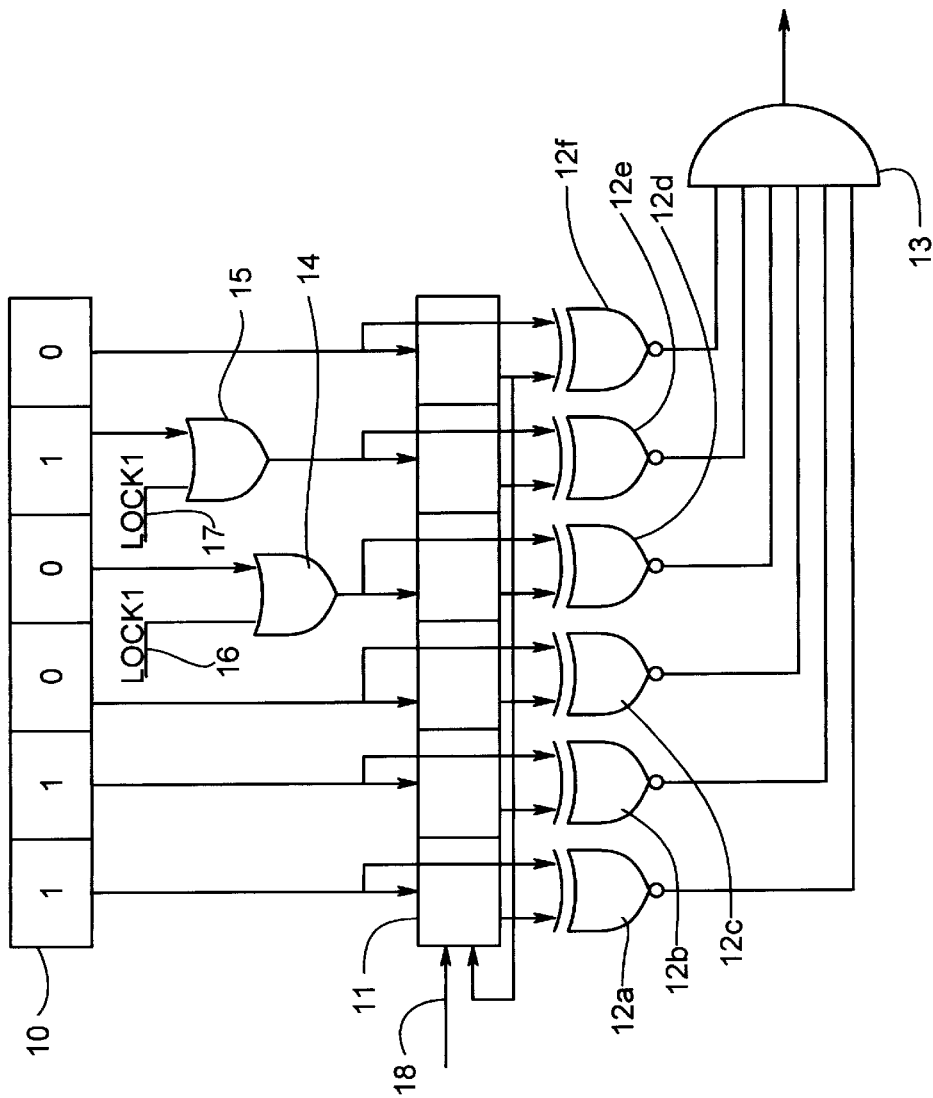

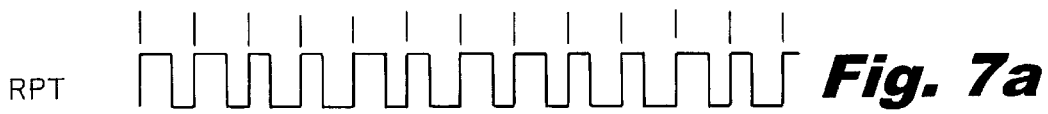
RPT  *Fig. 7a*
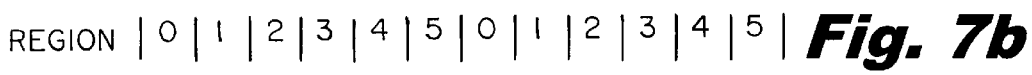
REGION  |0|1|2|3|4|5|0|1|2|3|4|5|  *Fig. 7b*
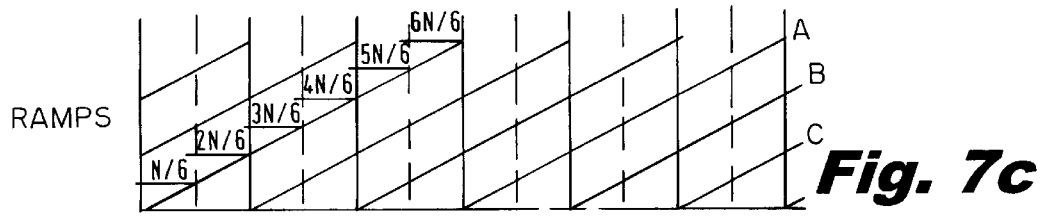
RAMPS  *Fig. 7c*
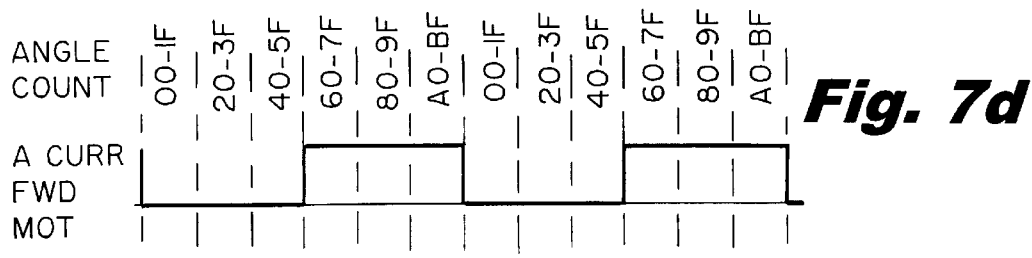
ANGLE COUNT
A CURR FWD MOT
*Fig. 7d*
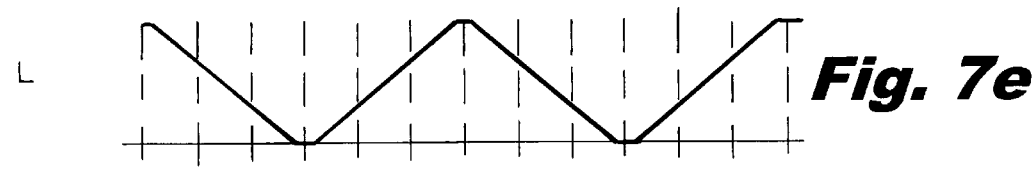
L  *Fig. 7e*
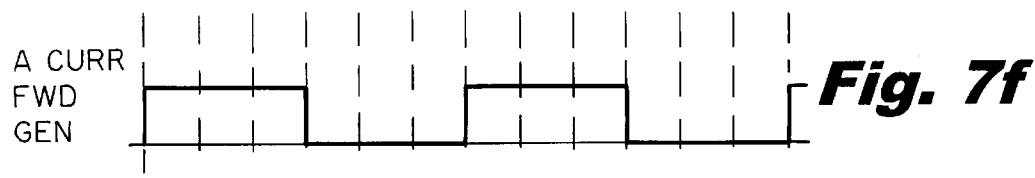
A CURR FWD GEN  *Fig. 7f*
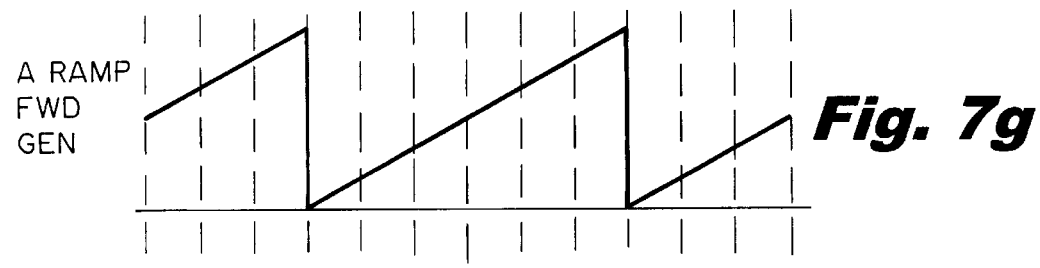
A RAMP FWD GEN  *Fig. 7g*

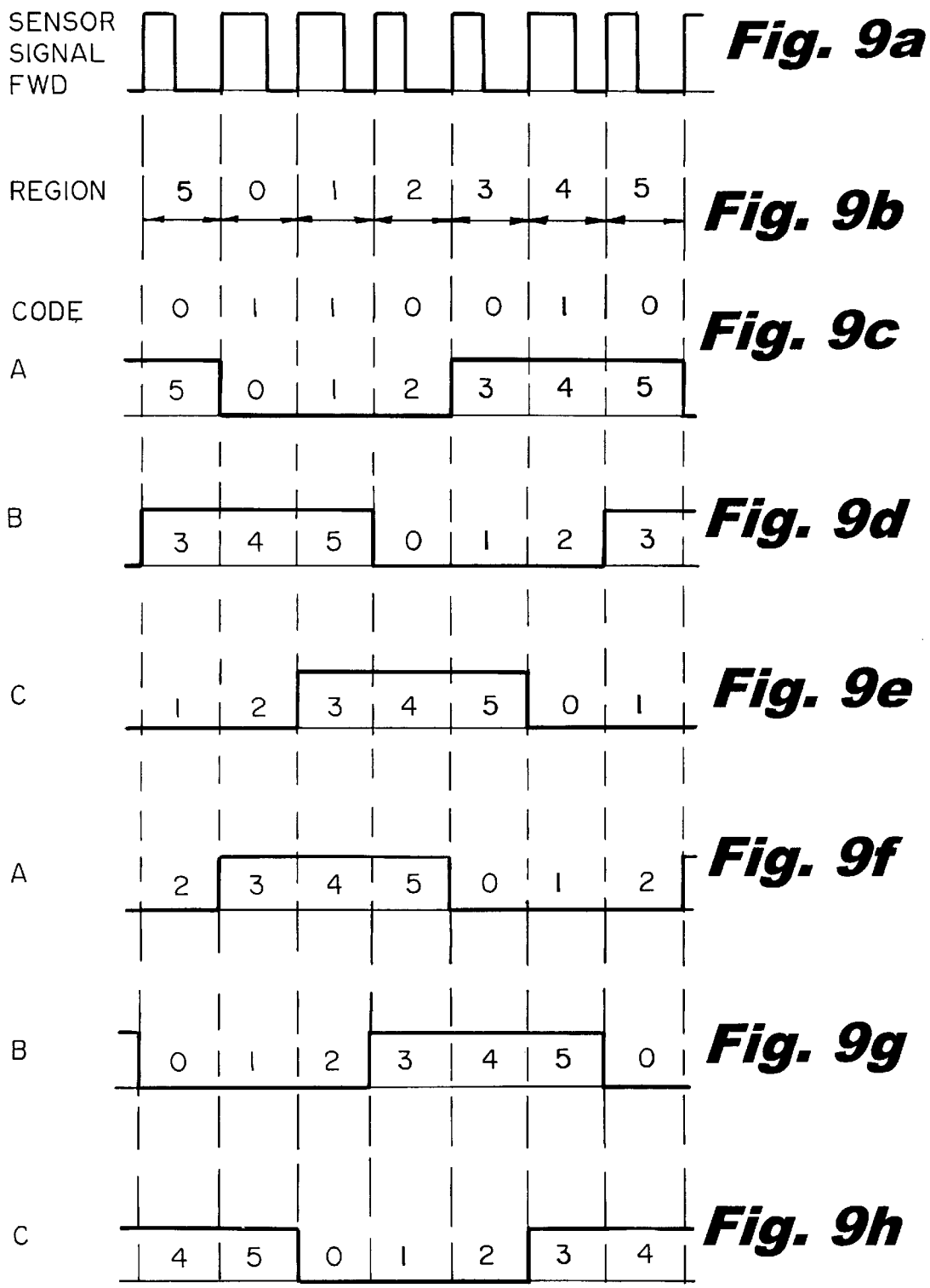

Fig. 11

| | REGION | PHASE A | | | PHASE B | | | PHASE C | | |
|---|---|---|---|---|---|---|---|---|---|---|
| | | 7 | 6 | 5 | 7 | 6 | 5 | 7 | 6 | 5 |
| FWDS MOTORING | 0 | 0 | 0 | 0 | 1 | 0 | 0 | 0 | 1 | 0 |
| | 1 | 0 | 0 | 1 | 1 | 0 | 1 | 0 | 1 | 1 |
| | 2 | 0 | 1 | 0 | 0 | 0 | 0 | 1 | 0 | 0 |
| | 3 | 0 | 1 | 1 | 0 | 0 | 1 | 1 | 0 | 1 |
| | 4 | 1 | 0 | 0 | 0 | 1 | 0 | 0 | 0 | 0 |
| | 5 | 1 | 0 | 1 | 0 | 1 | 1 | 0 | 0 | 1 |
| FWDS GENERATING | 0 | 0 | 1 | 1 | 1 | 0 | 1 | 1 | 0 | 1 |
| | 1 | 1 | 0 | 0 | 0 | 0 | 0 | 0 | 0 | 0 |
| | 2 | 1 | 0 | 1 | 0 | 0 | 1 | 0 | 0 | 1 |
| | 3 | 0 | 0 | 0 | 0 | 1 | 0 | 0 | 1 | 0 |
| | 4 | 0 | 0 | 1 | 0 | 1 | 1 | 0 | 1 | 1 |
| | 5 | 0 | 1 | 0 | 1 | 0 | 0 | 1 | 0 | 0 |

| | REGION | PHASE A | | | PHASE B | | | PHASE C | | |
|---|---|---|---|---|---|---|---|---|---|---|
| | | 7 | 6 | 5 | 7 | 6 | 5 | 7 | 6 | 5 |
| REV MOTORING | 0 | 0 | 1 | 0 | 1 | 0 | 0 | 0 | 0 | 0 |
| | 1 | 0 | 1 | 1 | 1 | 0 | 1 | 0 | 0 | 1 |
| | 2 | 1 | 0 | 0 | 0 | 0 | 0 | 0 | 1 | 0 |
| | 3 | 1 | 0 | 1 | 0 | 0 | 1 | 0 | 1 | 1 |
| | 4 | 0 | 0 | 0 | 0 | 1 | 0 | 1 | 0 | 0 |
| | 5 | 0 | 0 | 1 | 0 | 1 | 1 | 0 | 1 | 0 |
| REV GENERATING | 0 | 1 | 0 | 1 | 0 | 0 | 1 | 0 | 1 | 1 |
| | 1 | 0 | 0 | 0 | 0 | 1 | 0 | 1 | 0 | 0 |
| | 2 | 0 | 0 | 1 | 0 | 1 | 1 | 1 | 0 | 1 |
| | 3 | 0 | 1 | 0 | 1 | 0 | 0 | 0 | 0 | 0 |
| | 4 | 0 | 1 | 1 | 1 | 0 | 1 | 0 | 0 | 1 |
| | 5 | 1 | 0 | 0 | 0 | 0 | 0 | 0 | 1 | 0 |

Fig. 12b

|  | MOTORING | GENERATING |
|---|---|---|
|  |  |  |
| BIT 7 FWD A |  |  |
| BIT 7 REV C | 0,1,2,3 | 0,3,4,5 |
| BIT 6 BOTH B |  |  |
|  |  |  |
| BIT 7 BOTH B |  |  |
| BIT 6 FWD C | 2,3,4,5 | 0,1,2,5 |
| BIT 6 REV A |  |  |
|  |  |  |
| BIT 7 FWD C |  |  |
| BIT 7 REV A | 0,1,4,5 | 1,2,3,4 |
| BIT 6 FWD A |  |  |
| BIT 6 REV C |  |  |
|  |  |  |
| BIT 5 ALL | 0,2,4 | 1,3,5 |

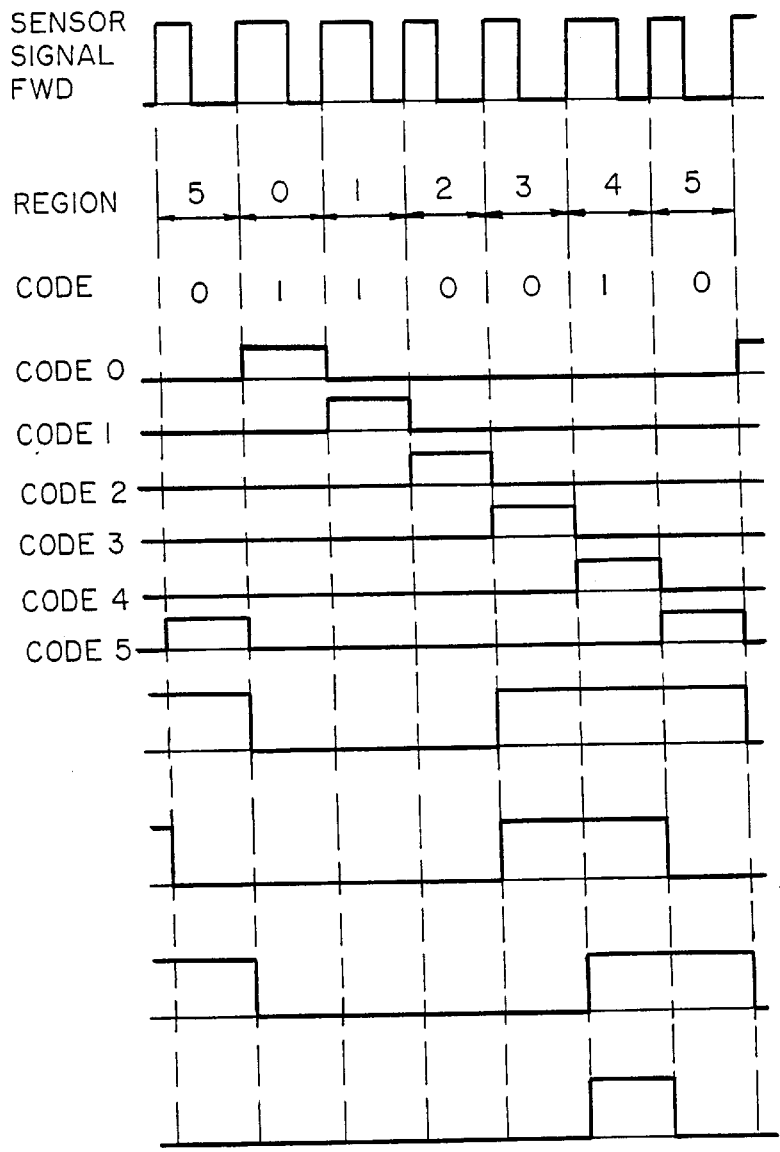

SINGLE SENSOR POSITION ENCODER PROVIDING TWO LEVELS OF RESOLUTION

BACKGROUND OF THE INVENTION

1. Field of the Invention

The present invention relates to a rotor position encoder for an electrical machine, and in particular for a switched reluctance electrical machine.

2. Description of Related Art

A switched reluctance machine comprises a stator including stator poles, and a rotor. Electronically switched windings are provided on the poles on the stator and, in the case of a switched reluctance motor, are energized in sequence to cause the rotor to rotate. Alternatively the system can be configured as a switched reluctance generator in which case the rotor is rotated physically to generate a current in the windings. The general theory of design and operation of switched reluctance motors is well known and discussed, for example, in *The Characteristics, Design and Applications of Switched Reluctance Motors and Drives* by Stephenson and Blake, presented at the PCIM '93 Conference and Exhibition at Nürnburg, Germany, Jun. 21–24, 1993, which is incorporated herein by reference.

In summary, when a rotor pole is exactly aligned with a stator pole, the machine is said to be in the aligned position. When current is flowing in the corresponding stator pole winding, there is no torque because the rotor is in a position of maximum inductance and hence minimum magnetic reluctance. If the rotor is rotated out of alignment (in either direction) then a restoring torque urges the rotor back into alignment when current is flowing in the stator pole winding. The stator and rotor are each provided with one or more pairs of poles in opposed relation. Each opposing pair of poles on the stator includes a common winding corresponding to one phase. Various configurations are commonly adopted in switched reluctance machines, for example a three-phase arrangement in which the stator has six poles (three opposed pairs) and the rotor has four poles (two opposed pairs).

The timing of the switching of the currents and the windings is controlled in relation to the relative angular positions of the stator and rotor poles. For example as a rotor pole rotates towards a phase winding, the phase winding may be energized as the rotor pole passes the minimum inductance position and de-energized as the rotor reaches its maximum inductance position.

At low speeds, the torque can be controlled by adjusting the peak level of the winding current. At high speeds, the peak level for the winding current is set at a high safety level which is not normally reached. The torque is adjusted by varying the angle within a phase period where the phase current is switched on (for positive volts on the winding) and off (for negative volts on the winding). In either case, a free-wheel angle may also be included (zero volts on the winding). At intermediate speeds, a combination of the two techniques is used so that the torque is controlled by both the switch on/off angle and a peak current (chopping) level.

It will be appreciated that it is necessary to be able to determine the angular position of the rotor in order to energize the windings at the correct moments. For example, the position of the rotor relative to the stator can be determined using an encoder comprising a slotted disc mounted on the rotor shaft in conjunction with a suitable sensor arrangement. The assembly is commonly known as a rotor position transducer (RPT). In one known system, three optical sensors are provided which are switched by the rotation of the disc. It has been shown that the combined RPI signals can be used to determine the rotor position to one-sixth of a phase period.

In an improved arrangement, which is described in detail in EP-A-0630097, incorporated by reference herein and assigned to Switched Reluctance Drives Limited, an RPT using a single sensor is provided in conjunction with a coded disc. Such a coded disc is shown in FIG. 1. The perimeter of the disc is toothed so as effectively to comprise of marks (corresponding to the teeth 1a) and spaces (corresponding to the gaps 1b between the teeth) which are read by a sensor 2. As the disc rotates in a given direction, a signal comprising a plurality of pulses having rising and trailing edges corresponding to the tooth edges will be produced. The teeth 1a are spaced such that the rising edges are evenly spaced, thus providing good timing markers for speed measurement. The "coding" of the disc is arrived at by providing teeth 1a of varying widths around the periphery of the disc. In the embodiment shown, the trailing edges are spaced either ¼ (narrow tooth) or ¾ (wide tooth) of the distance between the rising edges, to represent either a logic zero or a logic one respectively, thus developing a code. Accordingly the coded signal produced by the sensor can be compared with an internally stored code in a controller to establish the absolute position of the rotor relative to the stator.

While this system allows the benefit of using only one sensor, the position of the rotor can only be determined to a resolution level dependent upon the spacing of the rising edges on the coded disc. The spacing of the rising edges is linked to the number of bits in the code and the number of times the code repeats in a revolution of the rotor. The periodicity of the code is equal to the phase period of the machine, i.e. the period of the cyclical change in inductance of the phase as the rotor rotates. Numerically, the phase period is given by 360°/number of rotor poles. Within that phase period, the number of (evenly spaced) rising edges defines the number of bits in the code.

The number of bits in the code sets the resolution to which the rotor position may be determined. It is desired, however, to provide a higher level of resolution. In addition, it is desired to streamline the encoding logic.

SUMMARY OF THE INVENTION

According to embodiments of the invention there is provided a rotor position encoder for an electrical machine including a rotor and a stator, the encoder comprising a member, defining a set of features, mountable to rotate with the rotor, a sensor arranged to be influenced by the features to produce a first cyclical sensor output signal at a first resolution indicative of the position of the rotor and a counter arranged to be enabled by a plurality of points in each cycle of the first sensor output signal, to produce a second, counter output signal at a second higher resolution indicative of the incremental position of the rotor within a cycle of the sensor output signal. As a result, the rotor position may be detected with a high degree of accuracy.

Each feature may define a mark/space ratio of one of two or more predetermined values to influence the sensor, and the transition between a space and a mark may define a sensor edge, the counter being enabled at each sensor edge. These rising sensor edges may be evenly spaced.

A first shift register may be arranged to receive a value representative of the first output signal. A second shift register may be arranged to receive an internally generated value for comparison with the value representative of the first output signal in the first shift register, to establish whether a valid signal has been received.

The encoder may include means for combining a value representative of the first output signal and a value representative of the second output signal to provide a combined value representative of the rotor position, for example means for generating a first binary number representative of the first output signal and a second binary number representative of the second output signal and combining the first and second binary numbers to provide a binary number representative of the rotor position. The logic for processing the information may thus be simplified.

The encoder may be for a multi-phase electrical machine in which the value representative of the first output signal is selected dependent upon the machine phase, and the value representative of the second output signal is common to all machine phases.

According to embodiments of the invention there is further provided a method of encoding the position of a rotor in an electrical machine including a rotor and a stator wherein a set of features rotates with the rotor and influences a sensor, the sensor produces a first, cyclical sensor output signal at a first resolution indicative of the rotor position, and a counter is enabled by a plurality of points in each cycle of the first, sensor output signal and produces a second, counter output signal indicative of the incremental rotor position within a cycle of the sensor output signal.

The first output signal may be demodulated to a binary number, and the binary number may be inserted in a shift register. The binary number in the first shift register may be compared with an internally generated binary number in a second shift register to establish the validity of the binary number in the first shift register.

A value representative of the first output signal may be combined with the value representative of the second output signal to provide a combined value representative of the rotor position. A first binary number may be generated representative of the first output signal and a second binary number may be generated representative of the second output signal and the first and second binary numbers may be combined to produce a value representative of the rotor position. In a multi-phase electrical machine a first binary number may be generated for each of the phases and combined with a second binary number common to all of the phases. The combined value may be compared with a predetermined value in an angle firing controller and a phase winding in the electrical machine may be energized or de-energized when a match is made.

According to embodiments of the invention there is further provided a method of controlling an electrical machine including a stator having stator windings and a rotor, in which a sensor senses a characteristic of features rotating with the rotor as each feature passes the sensor, the characteristic of the features differing for respective features in a coded sequence and the sensor producing an output signal corresponding to the coded sequence and representative of the rotor position in which the output signal is converted by converting means to a coded block representative of the rotor position and a plurality of successive code blocks are combined in a predetermined manner to produce a control signal for controlling energization of the stator windings. The electrical machine may be a multi-phase machine and the code blocks may be combined in a predetermined manner dependent on the phase to which the control signal is to be applied. A simplified manner of control at low speeds is thus provided.

BRIEF DESCRIPTION OF THE DRAWINGS

The present invention can be put into practice in various ways some of which will now be described by way of example with reference to the accompanying drawings in which:

FIG. 3 shows an RPT output signal for a coded disc and energization regions for forward and reverse directions;

FIG. 5 is a logic diagram for the code compare system;

FIG. 7 illustrates the RPT output signal, corresponding angle ramps and current and inductance waveforms;

FIG. 9 illustrates the RPT output signal and corresponding positive and negative torque regions;

FIG. 11 shows the mapped binary codes for operation in each quadrant of operation of a machine, according to embodiments of the present invention;

FIG. 12b shows a simplified low bit table; and

FIG. 13 shows the various waveforms generated for head control operation.

DETAILED DESCRIPTION OF PREFERRED EMBODIMENTS

Figure 1:
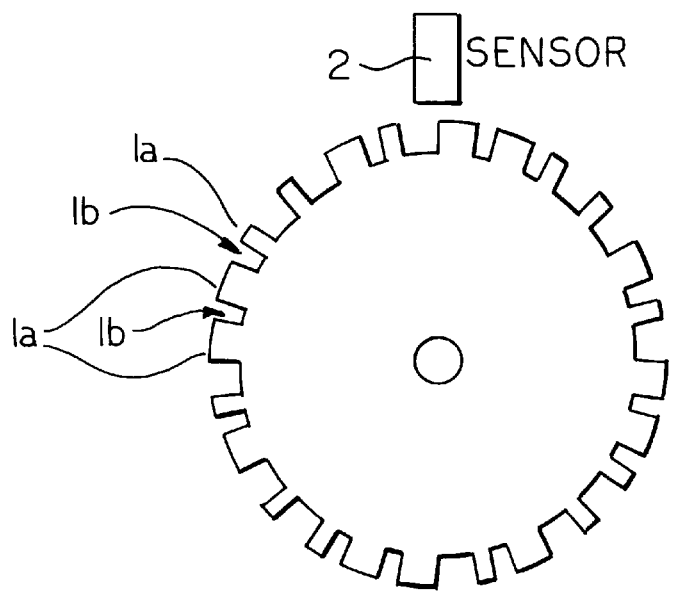
FIG. 1 shows a coded disc of a known type.
Figure 2:
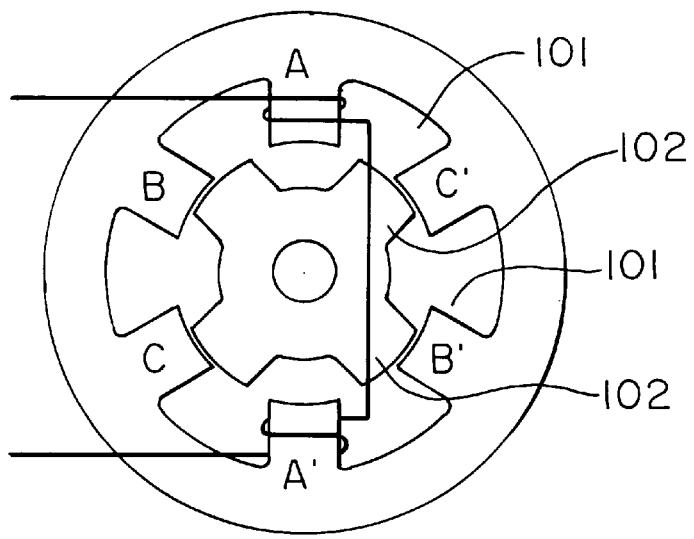
FIG. 2 shows schematically a typical three-phase switched reluctance machine.

The present invention relates to a rotor position encoder scheme for a switched reluctance machine having, in the exemplary embodiment, six stator poles 101 and four rotor poles 102 as shown in FIG. 2. The arrangement is thus a three-phase machine. A coded disc such as that shown in FIG. 1 is mounted coaxially with the rotor and a single sensor is provided for sensing the marks and spaces defined by the coded disc teeth. The sensor may be a Hall-effect sensor or an optical sensor or any other type of sensor such as a capacitance or inductance sensor.

It will be seen from FIG. 1 that the teeth 1a are arranged in a repeating pattern of six teeth which may be represented, treating the wide teeth as giving rise to a signal "1", i.e. a long mark:space ratio, and the narrow teeth as giving rise to a signal "0", i.e. a short mark:space ratio, as the binary code:

$110010$.

The tooth pattern progresses clockwise so as to give rise to the above binary code when the disc rotates counterclockwise past a sensor 2.

The RPT signal from the coded disc can, for example, be fed into an ASIC (application specific integrated circuit) in which the control system is implemented. A signal "1" is given for a long mark:space ratio between two rising edges and a signal "0" is given for a short mark:space ratio. Each value is placed into a shift register in turn so that a history of the received code can be developed. The RPT disc is aligned with the rotor to control the phase switching accurately. Where it is desired to read the signal corresponding to reversed rotation of the disc, the signal is merely inverted, as a result of which the ASIC can read the disc in the same manner and receive the same pattern for both directions of rotation by virtue of a simple operation.

The output of the single sensor is in the form of a pulse width modulated signal as shown in FIG. 3 for forward (anti-clockwise) and reverse (clockwise) motor directions.

The rising edges of the signal are assigned a number from 0 to 5. The regions between successive rising edges can similarly be numbered 0 to 5, where region 0 is defined as being the region between rising edges 0 and 1, and so forth. Within each region, the mark:space ratio defines a 1 or a 0 for the binary code, as described above.

If it is required to operate the machine in the conventional chopping mode where each phase is energized over 50% of its phase period, then adjacent sets of regions define the appropriate excitation angles, as shown in FIG. 3.

As mentioned above, the last six bits of the binary code are stored in a shift register and it will be seen from Table 1 below that the contents of the shift register give a unique six-bit number designating the current region. For example, if the binary code currently corresponds to the region numbered 0 according to the scheme discussed above, then the last six bits of code will be 110010. A unique hexadecimal or decimal number can thus be assigned to each region dependent on the value of the received code. The positive torque phase energization periods for each of phases A, B and C in the forward and reverse motor configurations are also shown ("1" designating phase energized and "0" designating phase de-energized).

TABLE 1

| Region | Received Code | HEX | DEC |
|---|---|---|---|
| 0 | 110010 | 32 | 50 |
| 1 | 100101 | 25 | 37 |
| 2 | 001011 | 08 | 11 |
| 3 | 010110 | 16 | 27 |
| 4 | 101100 | 2C | 44 |
| 5 | 011001 | 19 | 25 |

| FWD | | | REV | | |
|---|---|---|---|---|---|
| A | B | C | A | B | C |
| 0 | 1 | 0 | 0 | 1 | 0 |
| 0 | 1 | 1 | 1 | 1 | 0 |
| 0 | 0 | 1 | 1 | 0 | 0 |
| 1 | 0 | 1 | 1 | 0 | 1 |
| 1 | 0 | 0 | 0 | 0 | 1 |
| 1 | 1 | 0 | 0 | 1 | 1 |

Figure 4A:
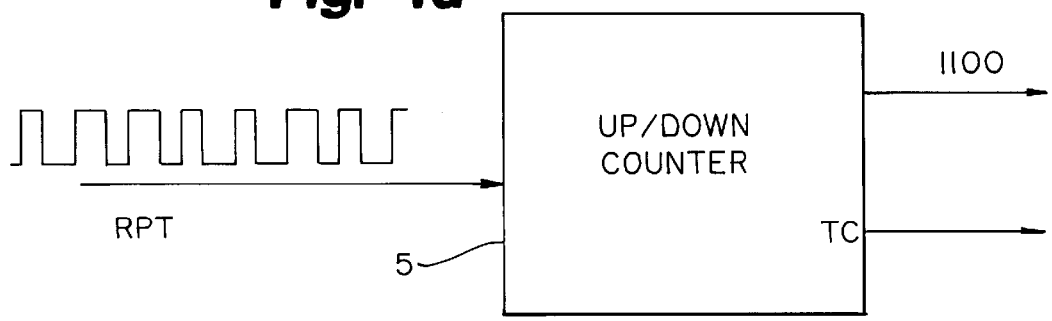
FIG. 4a shows demodulation of the RPT output signal.
Figure 4B:
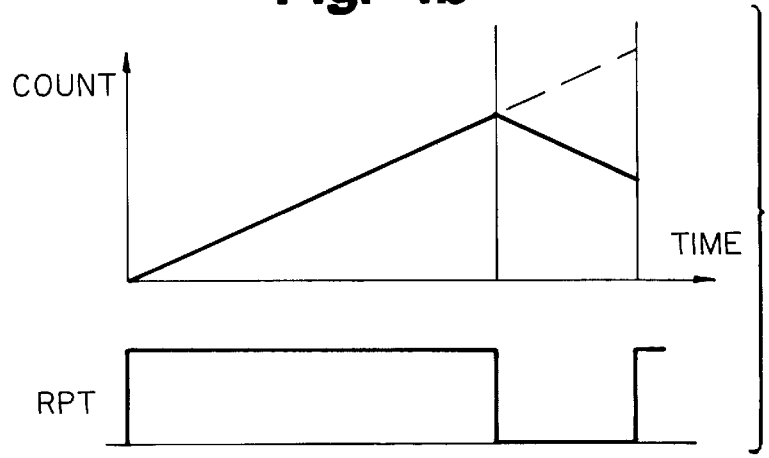
FIG. 4b shows demodulation of the RPT high output signal.
Figure 4C:
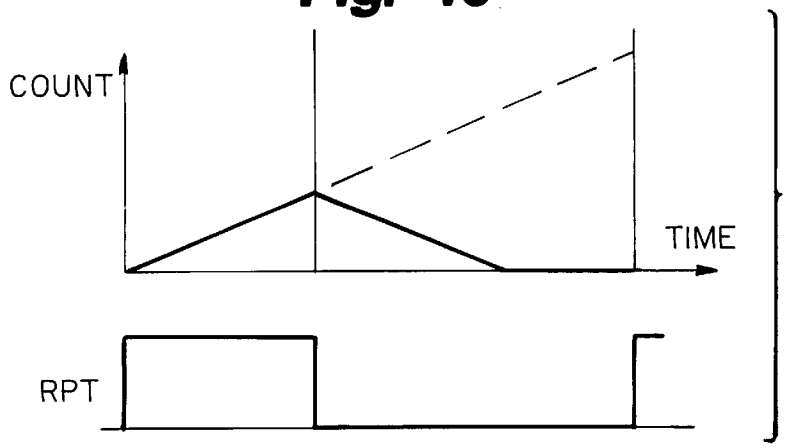
FIG. 4c shows demodulation of the RPT low output signal.

The manner in which the sensor signal is decoded is described with reference to FIGS. 4*a*, 4*b* and 4*c*. The sensor signal includes equally spaced rising edges, referred to herein as RPT_R. The RPT signal is input to an up/down counter 5 of known construction which can be arranged to count up while the RPT signal is high and then down while the RPT signal is low or vice versa. Assuming that the up/down counter 5 counts up while the RPT signal is high, then where the signal high is longer than the signal low the counter will not reach zero before the next rising edge is received (FIG. 4*b*). If the signal high period is shorter than the signal low period, the counter will be at zero at the next rising edge (FIG. 4*c*).

The counter also includes an output terminal, TC, which represents the terminal count. TC remains low while the counter is counting up until the maximum count of the counter is reached, whereupon TC goes high. Conversely, if the counter is counting down, TC stays low until the counter reaches zero, whereupon TC goes high. It will be seen from FIG. 4*b* and 4*c* that TC will therefore only go high if the mark:space ratio of the sensor signal between rising edges is less than 1. The inverse of the TC therefore gives the appropriate binary digit for that part of the sensor signal. The decoded signal is then input to a six bit shift register (described below) which shifts one bit to the right at each rising edge of the sensor signal.

Referring now to FIG. 5, the word in the shift register 10 is compared with an internally generated word to determine the rotor position.

The output of the sensor, processed as described above, is fed into the six bit shift register 10. The shift register 10 shifts right one place on each RPT signal rising edge RPT_R. The contents of the shift register at any one time form a unique word known as a DECODE. There are six DECODES, each of which corresponds to one of the six possible regions shown in Table 1 above, only one of which can be present at any time.

An internally generated code is maintained on a second shift register 11. Once again the internally generated code is shifted right one place on each RPT rising edge RPT_R, under normal operation. The contents of shift register 11 at any one time also form a unique word, known as a CODE. There are six CODES, each of which corresponds to a valid DECODE in shift register 10. The bits of each CODE are compared with the appropriate bits of the DECODE to determine if the CODE and DECODE are equal. This comparison is carried out by comparators 12*a* to 12*f*, one for each bit of the respective shift registers 10, 11. The outputs of the comparators 12*a* to 12*f* input to a gate 13 which in turn outputs a logic 1 if all six bits correspond. If the CODE and DECODE do not match then the code shift register 11 can be reloaded with the latest DECODE using the parallel load input, 18.

FIG. 5 also shows OR gates 14, 15 and LOCK1 and LOCK2 signals 16,17. During normal operations, LOCK1 and LOCK2 are low. Their use will be described below.

The loading of the CODE shift register 11 is shown in more detail in Table 2. In the absence of a shift signal (initiated by the signal rising edge RPT_R) or a parallel load signal (initiated by the reloading of the correct DECODE in the case of a mis-match) the shift register continues to hold its existing state until a suitable command is received. If a parallel load signal is received in the case of a mis-match, the appropriate DECODE is reloaded. When a shift pulse is received on an RPT rising edge RPT_R, the CODE shift register 11 shifts one place to the right. Where a shift signal and a parallel load signal are both received, the parallel load signal overrides and the CODE shift register 11 is reloaded with the correct DECODE.

TABLE 2

| SHIFT | PARALLEL LOAD | SECTION OUTPUT |
|---|---|---|
| 0 | 0 | Stay in the same condition. |
| 0 | 1 | Re-load with the appropriate DECODE. |
| 1 | 0 | Shift right one place. |
| 1 | 1 | Re-load with the appropriate DECODE. |

It will be seen that the system described can interpret the movement of the coded disc and produce signals which are linked to the phase period of the machine. Further, the system described gives rise to a resolution equivalent to the period between two rising edges on the coded disc signal.

The system can be further improved, allowing a yet higher degree of resolution, by introducing "facet control". In a simplified system, interpolation of the position of a rotor for a given phase can be derived from the count value of an up counter set to count between zero and a maximum value within one phase period, the counter being reset at the beginning of each period. The count may be viewed as an angle ramp which is read off to establish the position of the rotor at an intermediate point. The rate of counting is set at the beginning of each phase period such that, if the rotor continues to rotate at the constant velocity detected at the beginning of the period, the counter will reach its maximum value at the end of the period.

The idea of facet control is that the standard angle ramp, which was originally reset at the end of a phase period, and allowed to free run in between, is subdivided into facets. The problem of the free running angle ramp, in which the speed of the ramp is dependent on the speed of the rotor at the start of the cycle, is that by the end of the electrical cycle the speed of the rotor may have changed and the ramp may have run too fast and overshot the desired end point, or may have run too slowly and undershot. This introduces errors in the angle control system and could position the firing angles in the wrong place.

Figure 6:
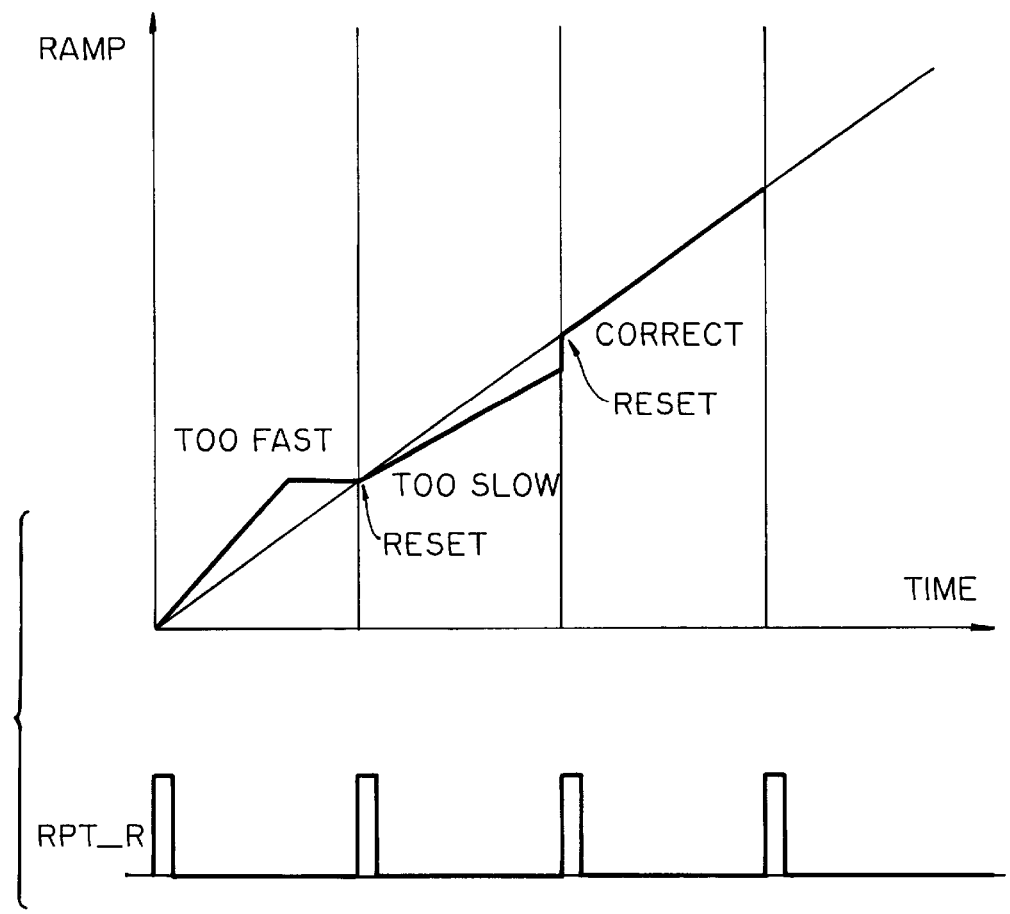
FIG. 6 illustrates facet count control.

As shown in FIG. 6, facet control overcomes this by, at the end of each sub-section or "facet" of the ramp, resetting the counter and the ramp rate and starting again. These individual shorter ramps are combined to produce one ramp. The single-head system is ideal for this type of control because of the equally spaced rising edges of the RPT signal. Each rising edge provides a counter reset giving 6 facets per phase period. FIG. 6 shows a simplified view of 3 facets. As can be seen from FIG. 6, although within individual facets the ramp rate may be too fast or too slow because of the variations in the rotor speed, because the ramp is corrected at each facet a higher degree of accuracy can be provided for the angle control system.

Referring now to FIG. 7, where aspects of control of the system are shown in more detail:

(a) shows the RPT output signal and the corresponding binary codes;

(b) shows the signal broken up into six unique regions each equal to one bit of the repeating RPT code;

(c) shows the angle ramps for each of phases A, B and C. As an example, one cycle of phase A is broken up into six facets. For reasons discussed in more detail below, the up counter is arranged to count to a maximum value N=192, each of the facets then corresponding to a count of N/6=32. The angle count is shown in the figure expressed in hexadecimal.

(d) illustrates one possible scheme for applying current to the phase A windings. In the example shown, the simple case in which current is applied in the second half of the cycle is shown. The corresponding inductance profile is shown at (e). It will be seen that current is applied when the system is at a point of minimum inductance and switched off at the point of maximum inductance. A more sophisticated approach to excitation of the phase will be described below.

(f) and (g) show the phase energization and angle ramp waveforms for forwards generating, as opposed to the forwards motoring configuration shown in (c) to (e).

In this system the following information is available:

1. The position of the rotor can be derived at a first resolution by examining the signal from the coded disc and establishing the position to within a region; and 2. The position can be derived from the angle count within a facet to provide a higher resolution indicative of the incremental position of the rotor.

Figure 8:
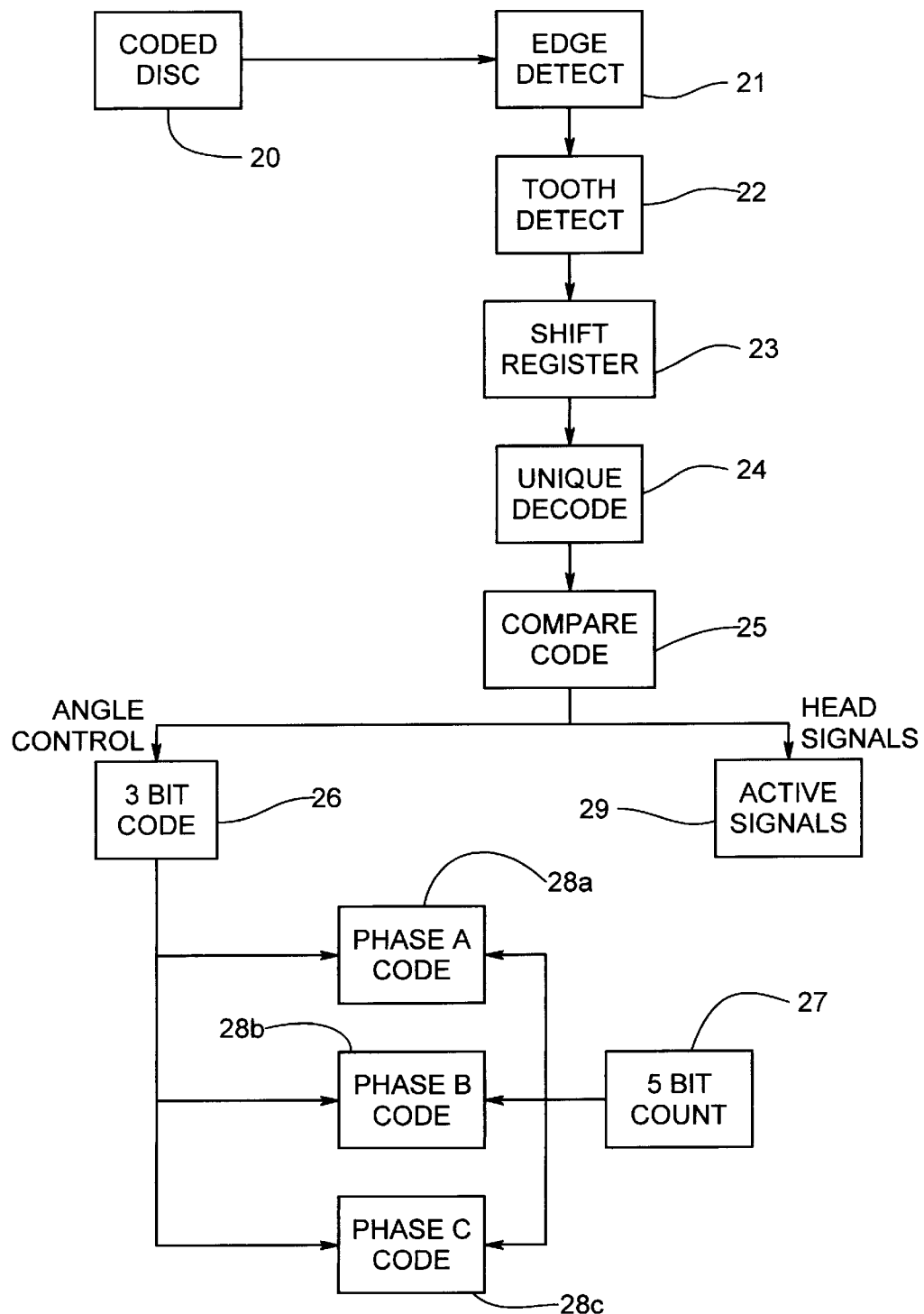
FIG. 8 is a block diagram showing RPT signal decoding.
Figure 10A:
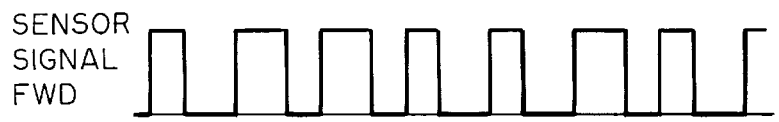
FIG. 10 illustrates the RPT output signal and corresponding reverse motoring and generating current waveforms.
Figure 10B:
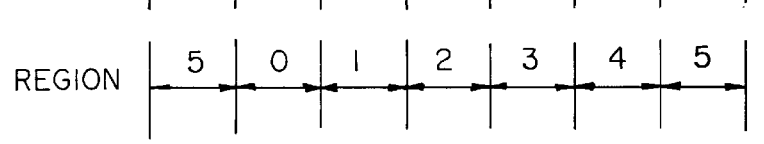
Figure 10C:
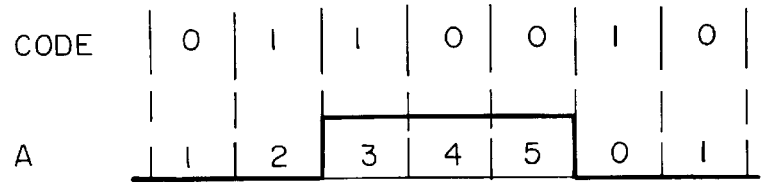
Figure 10D:
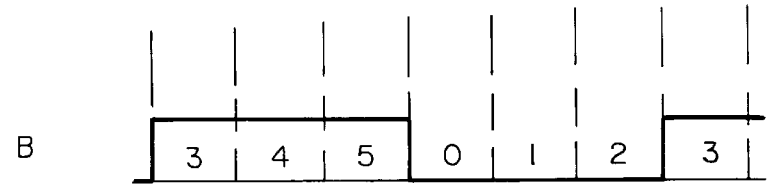
Figure 10E:
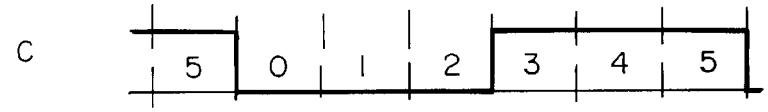
Figure 10F:
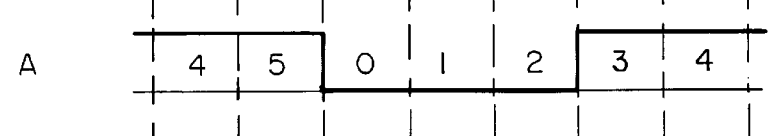
Figure 10G:
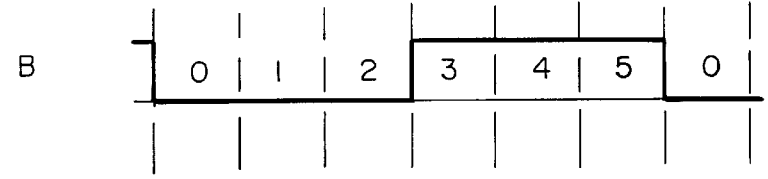
Figure 10H:
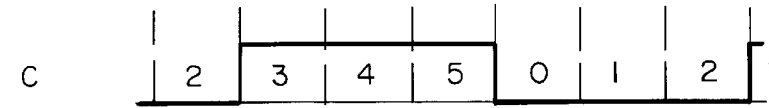

FIG. 8 is a block diagram showing a preferred method of combining the information and transferring it to a suitable firing control system.

RPT information is derived from the coded disc at step 20 as discussed above. A rising edge detector generates rising edge pulse RPT_R at step 21 and the tooth length detector (for example the up/down counter discussed with reference to FIGS. 4a, 4b, 4c) outputs a high or low signal at 22. The corresponding binary bit is input to a shift register at step 23, the shift register being shifted at each RPT_R. The unique DECODE is then derived at step 24 as described above with reference to Table 2 and the comparison between a DECODE and the internally generated CODE is made at step 25. At this point, the control system decides (according to known techniques) what excitation strategy will be adopted for exciting the phase windings. FIG. 8 shows two choices, where the excitation is either in the form of blocks of current (as was discussed in connection with FIG. 7) or in the "angle control" mode, as will now be discussed.

Referring firstly to FIG. 9, for each phase it is first defined what firing scheme is desired; that is, the portion of the phase period over which positive torque exists in the desired direction is defined. In FIG. 9, (a) shows the RPT code (forwards) and (b) shows the corresponding region numbering. Each of the phases at (c), (d) and (e) are split into six sectors, each sector equal in length to one region of the RPT code. The position of sector zero is chosen to commence on the transition from a positive torque producing region to a negative torque producing region. The sectors within a phase period are labelled sequentially from 0 to 5. It will be seen that only in specific circumstances will the RPT signal region numbering correspond to the phase period sector numbering. The following discussion is principally concerned with the forwards motoring conditions but it will be appreciated that forwards generating, reverse motoring and reverse generating schemes are also operable in a similar manner as shown in (f)–(h) of FIG. 9, and (a) to (h) of FIG. 10.

The sector number for each phase corresponding to a given region can be derived for each of the four quadrants of operation (forwards motoring, forwards generating, reverse motoring, reverse generating). The sector number (expressed in binary) is then mapped to the appropriate region. For example for forwards motoring, region 0 has for phase A, sector 0 (000), phase B, sector 4 (100) and phase C, sector 2 (010) mapped to it. The mapping is shown in FIG. 11, with each of the sector numbers corresponding to the region number expressed in binary.

As discussed above, it is desired to combine the sector number with the corresponding facet count. As each facet count has a maximum value of 192/6=32, it can be expressed as a five digit binary number i.e. as a five-bit binary number. In addition, the sector numbers corresponding to a given region can be expressed as a three-bit binary number. Accordingly these numbers are combined as an eight-bit binary number, the three-bit binary sector numbers forming the top three most significant bits (MSB's) of the eight-bit number. This is shown in more detail in FIG. 8. The correctly matched DECODE from step 25 in FIG. 8 gives rise to a region number which is read off in a table such as that shown in FIG. 11 to obtain the three-bit binary sector number for each phase in the desired operating quadrant at step 26.

Referring once again to FIG. 8, the count number within the corresponding facet is continuously generated at step 27 giving a five-bit number. The three-bit number for each phase together with the five-bit number common to all of the phases are combined for each phase to give rise to a unique word for each phase at steps 28a, 28b and 28c. It will be seen that the three-bit code for each phase will change at each RPT signal rising edge RPT__R, while the five-bit count will increment at each count of the up counter. Accordingly, at any stage, the eight-bit number will give an indication of which sector the rotor is in, and how far through that sector the rotor has progressed, thus giving a high resolution indication of the position of the rotor. The eight-bit number is then compared with an eight-bit number (not shown) representing the desired firing angle, and when a match is recorded, the corresponding phase is energized or de-energized as appropriate.

Figure 12A:
FIG. 12a shows the low bit tables for the binary codes of FIG. 11.

It will be realized that the three-bit number identifying a required sector could be obtained by simply storing all the information in, e.g., FIG. 11 and reading out the appropriate number for a given quadrant, region and phase. However, this is wasteful of storage and expensive in terms of the logic required. A preferred embodiment of obtaining the three-bit number is now described with reference to FIGS. 11, 12(a) and 12(b). The three bits of each number representing the sector number and forming the three MSB's of the eight-bit number can be numbered bits 7, 6 and 5, as shown in FIG. 12(a). The three-bit sector number can then be located by identifying when each bit of it is low, in each region. For example, as shown in FIG. 12(a), for forwards motoring, bit 7 is low in region 0, 1, 2 and 3, bit 6 is low in region 0, 1, 4 and 5 and bit 5 is low in region 0, 2 and 4. It can be seen from the full set of tables derived in FIG. 12(a) for all four quadrants of operation that a pattern emerges. For example for motoring operation, bit 7 for Phase B is unchanged when the direction changes, whereas the patterns for Phases A and C are interchanged. The same holds for bit 6. Bit 5 pattern is unchanged. By inspection, the same pattern holds for generating. This allows all the required information to be held by storing only eight patterns. This is shown in FIG. 12(b) and greatly reduces the storage and logic requirements. In particular, given the region number and quadrant of operation the value of each bit 5, 6 and 7 can be determined from the table at FIG. 12(b).

FIG. 8 also showed an alternative mode of operation for low speed in which head active signals are generated at step 29. Once again the same facet information can be used but operation is made simple by the fact that "blocks" of current are used over complete regions (as shown, e.g. in FIG. 7 at (d)) and the ramp generation system is not required.

In head control, the system can be operated directly by CODE__0 to CODE__5 signals as shown in FIG. 13. These signals are simply used to indicate when the rotor is in any of regions 0 to 5. In the known "1½ phases on" activation scheme shown in FIG. 7 at (d) and FIG. 13 at (a) where three successive regions correspond to the active signal, the CODE__0 to CODE__5 signals can be simply combined together to produce one signal for each phase. For example, during forwards motoring, the active signal for phase A is high during regions 3, 4 and 5 and thus CODES__3, __4 and __5 are simply combined together to provide the activation signal. To go in the reverse direction, phases A and C are simply swapped.

Alternative activation schemes can be envisaged—for example if "first two third" current operation is required (see (b) in FIG. 13) then CODES__3 and __4 are combined and if "second two third" current operation is required (see (c) in FIG. 13) the CODE__4 and CODE__5 signals can be combined. This can be achieved by simple gating to suppress the third sector or the first sector of the active signal respectively. FIG. 13 at (d) shows middle third current operation.

To start the drive, the rotor is pulled into a predetermined position by exciting a predetermined phase or phases. Once the rotor is in the correct position, the circuitry of the RPT is set to a predetermined state to synchronize it with the physical position of the rotor.

This setting of the circuitry is achieved by a two-position lock routine of a type known to the skilled person to guarantee that the rotor is in the expected position. The system first of all locks in region 3 where, in forward motoring, phases A and C are on together and phase B is off. The second half of the lock cycle locks into region 4 where phase A is on and phases B and C are off. This is achieved by the use of the LOCK1 and LOCK2 signals shown in FIG. 5. A secure locking, and a guaranteed correct start position are thus provided. The system uses the fact that the shift register on start either needs to be clocked twice if the RPT is high or once if the RPT is low. To achieve this, the appropriate regions are set high artificially in the compare with the decode and internally generated codes section, and the shift register is parallel loaded. This then ripples through the system and the head phase active signals are produced.

It will be appreciated that, although the above discussion has been directed at four-quadrant operation (forwards motoring, forwards generating, reverse motoring and reverse generating) it can also be used for dual-quadrant operation (e.g. forwards and reverse motoring only). This is achieved by simply removing (or ignoring) the relevant definitions of the generating waveforms and parts of the tables in FIGS. 11 and 12, and similarly removing the internal motoring or generating signal.

Further, the illustrative embodiment has related to a machine with three phases. The invention can be equally applied to a machine with a different number of phases simply by taking note of the different length of the phase inductance period and making the appropriate adjustments.

While the invention has been described in connection with the illustrative embodiments discussed above, those skilled in the art will recognize that many variations may be made without departing from the present invention. For example, the present invention is applicable to inverted machines in which the stator is in the center of the machine and the rotor is arranged to rotate around the outside of the stator. Accordingly, the above description of several embodiments is made by way of example and not for the purposes of limitation. The present invention is intended to be limited only by the spirit and scope of the following claims.

What is claimed is:

1. A rotor position encoder for an electrical machine including a rotor and a stator, the encoder comprising a member defining a set of features, mountable to rotate with the rotor, a single sensor, the single sensor of the encoder being arranged to be influenced by the features to produce a cyclical sensor output signal at a first resolution indicative of the position of the rotor, and a device arranged to be enabled by a plurality of points in each cycle of the sensor output signal produced by the single sensor, to produce a device output signal at a second higher resolution indicative of the incremental position of the rotor within a cycle of the sensor output signal produced by the single sensor, both the cyclical sensor output signal and the device output signal thus being based on the single sensor.

2. An encoder as claimed in claim 1 in which the features define a mark/space ratio to influence the sensor, each mark/space ratio having one of two predetermined values.

3. An encoder as claimed in claim 2 in which the transition between a space and a mark defines a sensor edge, the device being enabled at each sensor edge.

4. An encoder as claimed in claim 3 in which the sensor edges are evenly spaced.

5. An encoder as claimed in claim 1 including a first shift register arranged to receive a value representative of the cyclical sensor output signal.

6. An encoder as claimed in claim 5 comprising a second shift register arranged to receive an internally generated value for comparison with the value in the first shift register.

7. An encoder as claimed in claim 1 including means for combining a value representative of the cyclical sensor output signal and a value representative of the device output signal to provide a combined value representative of the rotor position.

8. An encoder as claimed in claim 7 including means for generating a cyclical sensor binary number representative of the first output signal and a second binary number representative of the second output signal and combining the first and device binary numbers to provide a binary number representative of the rotor position.

9. An encoder as claimed in claim 7 for a multi-phase electrical machine in which the value representative of the cyclical sensor output signal is selected dependent upon the machine phase, and the value representative of the device output signal is common to all machine phases.

10. A switched reluctance machine including an encoder as claimed in claim 1.

11. An encoder as claimed in claim 1 in which the set of features is a single set of features, the single sensor of the encoder being arranged to be influenced by the single set of features.

12. A method of encoding the position of a rotor in an electrical machine including a rotor and a stator wherein a set of features rotates with the rotor and influences a singe sensor, the method comprising: producing with the single sensor a cyclical sensor output signal at a first resolution indicative of the rotor position, enabling a counter, initiated from the sensor output signal, to count at a plurality of points in each cycle of the sensor output signal, and producing a counter output signal indicative of the incremental rotor position within a cycle of the sensor output signal produced by the single sensor, both the sensor output signal and the counter output signal thus being based on the single sensor.

13. A method as claimed in claim 12 in which the cyclical sensor output signal is demodulated to a binary number, and the binary number is inserted in a first shift register.

14. A method as claimed in claim 13 in which the binary number in the first shift register is compared with an internally generated binary number in a second shift register to establish the validity of the binary number in the first shift register.

15. A method as claimed in claim 12 in which a value representative of the cyclical sensor output signal is combined with a value representative of the device output signal to provide a combined value representative of the rotor position.

16. A method as claimed in claim 15 in which a first binary number is generated representative of the cyclical sensor output signal and a second binary number is generated representative of the device output signal and the first and second binary numbers are combined to produce a combined value representative of the rotor position.

17. A method as claimed in claim 16 for a multi-phase electrical machine in which a first binary number is generated for each of the phases and is combined with a second binary number common to all of the phases.

18. A method as claimed in claim 16 in which the combined value is compared with a predetermined value in an angle firing controller and a phase winding in the electrical machine is energized or de-energized when a match is made.

19. A method as claimed in claim 12 for a multi-phase electrical machine in which the cyclical sensor output signal represents a position value indicative of the rotor position, and for each phase a corresponding phase-specific value is defined for each of one or more desired modes of operation of the machine, the energization or de-energization of a phase winding for a mode of operation being dependent on the respective phase-specific value for that mode.

20. A method as claimed in claim 19 in which the phase-specific value is represented by an N-bit binary number derived by correlating phase and mode of operation with identification of which bits in the N-bit binary number are in a predetermined state for each position value wherein the N-bit binary number is constructed from a table given the phase, mode and position value information.

21. A method as claimed in claim 12 in which the set of features is a single set of features, the single set of features influencing the single sensor.

22. A method as claimed in claim 21 in which the counter output signal is of a resolution that is higher than the first resolution.

23. A method as claimed in claim 12 in which the counter output signal is of a resolution that is higher than the first resolution.

24. A method of controlling an electrical machine including a stator having stator windings, a rotor, and a single sensor which senses a characteristic of features rotating with the rotor as each feature passes the sensor, the characteristic of the features differing for respective features in a coded sequence, the method comprising: arranging the single sensor to produce a different output for each of the differing characteristics of the features in accordance with the coded sequence at a first resolution and enabling a device at a plurality of points in each cycle to produce a second output signal at a second higher resolution, which outputs form an output signal that is representative of the rotor position, converting the output signal by converting means to a code block representative of the rotor position, and combining a plurality of successive code blocks in a predetermined manner to produce a control signal for controlling energization of the stator windings.

25. A method as claimed in claim 24 in which the electrical machine is a multi-phase machine and the code blocks are combined in a predetermined manner dependent on the phase to which the control signal is to be applied.

26. A method as claimed in claim 24 in which the features are a single set of features, the single sensor sensing the single set of features.

27. A rotor position encoder for an electrical machine including a rotor and a stator, the encoder comprising means for defining a set of features, mountable to rotate with the rotor, means for sensing, the means for sensing arranged to be influenced by the features to produce a single cyclical sensor output signal at a first resolution indicative of the position of the rotor, and means for being enabled by a plurality of points in each cycle of the single sensor output signal, to produce a device output signal at a second higher resolution indicative of the incremental position of the rotor within a cycle of the single sensor output signal.

28. An encoder as claimed in claim 27, in which the means for defining defines a mark/space ratio to influence the means for sensing, each mark/space ratio having one of two predetermined values.

29. An encoder as claimed in claim 27, including first shift register means for receiving a value representative of the cyclical sensor output signal.

30. An encoder as claimed in claim 29 further comprising second shift register means for receiving an internally generated value for comparison with the value in the first shift register means.

31. An encoder as claimed in claim 27 in which the set of features is a single set of features and the means for sensing is a single means for sensing, the single means for sensing being arranged to be influenced by the single set of features.

* * * * *